(12) United States Patent
Fujimoto (10) Patent No.: US 6,399,470 B1
(45) Date of Patent: Jun. 4, 2002

(54) METHOD FOR FORMING CONTACT HOLES ON CONDUCTORS HAVING A PROTECTIVE LAYER USING SELECTIVE ETCHING

(75) Inventor: Mamoru Fujimoto, Tokyo (JP)

(73) Assignee: Oki Electronic Industry Co., Ltd., Tokyo (JP)

( * ) Notice: Subject to any disclaimer, the term of this patent is extended or adjusted under 35 U.S.C. 154(b) by 0 days.

(21) Appl. No.: 09/781,422

(22) Filed: Feb. 13, 2001

(30) Foreign Application Priority Data

Oct. 5, 2000 (JP) .......................................... 12-305675

(51) Int. Cl.$^7$ ..................... H01L 21/8238; H01L 21/76; H01L 21/44; H01L 21/4763; H01L 21/302
(52) U.S. Cl. ..................... 438/597; 438/233; 438/453; 438/634; 438/637; 438/723; 438/724
(58) Field of Search ................................. 438/637–641, 438/634, 672, 723, 724, 756, 757, 595, 597, 427, 424, 296, 453, 256, 399, 233, 700, 675

(56) References Cited

U.S. PATENT DOCUMENTS

| | | | |
|---|---|---|---|
| 5,683,922 A | | 11/1997 | Jeng et al. .................. 438/297 |
| 5,976,972 A | * | 11/1999 | Inohara et al. |
| 6,083,828 A | | 7/2000 | Lin et al. .................... 438/639 |
| 6,300,178 B1 | * | 10/2001 | Sunouchi |

\* cited by examiner

*Primary Examiner*—Ha Tran Nguyen
(74) *Attorney, Agent, or Firm*—Volentine Francos, PLLC

(57) ABSTRACT

A protective film (14) on a conductor (11d), where a contact hole (22) is to be formed, is removed in advance in a forming process of an etched-away opening (20) to expose the top portion of the corresponding conductor (11d) from the top surface of an insulating film (15), which has buried therein the conductor (11d) covered with the protective film. The etched-away opening (20) is refilled with the same kind of material as that for the insulating film (15), and then two contact holes, one (21) that opens to the semiconductor substrate (10) substantially devoid of the protective film and the other (22) that opens to the conductor (11d), are formed by simultaneous etching under substantially the same condition.

6 Claims, 8 Drawing Sheets

METHOD FOR FORMING CONTACT HOLES ON CONDUCTORS HAVING A PROTECTIVE LAYER USING SELECTIVE ETCHING

DETAILED DESCRIPTION OF THE INVENTION

1. Field of the Invention

The present invention relates to a method for manufacturing a semiconductor device, and more particularly to a method for forming contact holes for conductive strips passing through an insulating film, such as an interlayer insulating film.

2. Description of Related Art

In semiconductor devices, including semiconductor elements, such as MOS transistors, when contact holes, which run through an insulating film, where the MOS transistors are buried, and which open to active regions on the semiconductor substrate, are formed between gate electrodes of a pair of MOS transistors on a semiconductor substrate, for example, they are generally formed by a self-aligned contact process.

According to the self-aligned contact process, a protective film of silicon nitride, for example, is formed to cover gate electrodes for MOS transistors on a semiconductor substrate, for example. Moreover, an insulating film of silicon oxide is formed to bury the gate electrodes along with the protective film in it. On this insulating film, wiring for a multi-layered structure is formed when necessary, and prior to this wiring work, to form contact holes that open to the semiconductor substrate between the gate electrodes, those regions of the insulating film which are located between the gate electrodes are subjected to an etching process using an etching mask and an etching gas to expose the above-mentioned regions between the gate electrodes.

Because the etching gas shows a notably low etching rate to the protective film than to the insulating film, the protective film serves to protect the gate electrodes from the etching gas during etching. When the side-wall portions of the protective film which cover the side walls of the gate electrodes are exposed in the course of the etching process, the side-wall portions function as etching stoppers, and contact holes can be formed between the gate electrodes with high accuracy regardless of placement accuracy of the etching mask, so that specified conductive property can be obtained by a conductive material used to fill the contact holes.

Meanwhile, in conventional semiconductor devices such as have been mentioned above, it is often required to provide two contact holes: a contact hole that opens to the surface of the semiconductor substrate and another contact hole that opens to a conductor, such as a gate electrode under the protective film.

In the former, the contact hole can be formed by a single etching process in a specified position of the insulating film. In the latter, however, after the insulating film has been etched, the exposed protective film needs to be etched. Because the protective film has a different etching-resistant characteristic from that of the insulating film, their etching conditions differ to a large extent in the forming process of the two contact holes.

For this reason, in the conventional manufacturing method, it is necessary to separately carry out an etching process using a mask for the contact hole that opens to the surface of the semiconductor substrate, and an etching process using a mask for the contact hole that opens to the conductive line under the protective film. Therefore, it is necessary to set a relative position of the two masks for the different contact holes with accuracy.

In this respect, there has been requirement for a method for forming two contact holes with high accuracy and with improved facility.

To solve the above problem, the present invention adopts the following structure.

SUMMARY OF THE INVENTION

In manufacturing a semiconductor device having a semiconductor substrate, a conductor formed on the semiconductor substrate and covered with a protective film, and an insulating film deposited above the semiconductor substrate to cover the conductor, a method for forming a first contact hole running through the insulating film and opening to the surface of the semiconductor substrate or to an electric connection member buried in the insulating film, and a second contact hole laterally positioned relative to the first contact hole running through both the insulating film and the protective film and opening to said conductor under the protective film, the contact-hole forming method comprises the steps of:

forming an etched-away opening running from the upper surface of the insulating film to expose the top portion of the conductor corresponding to the opening by using an etching medium exhibiting a higher etching rate to the protective film than to the insulating film to partially remove by etching the protective film on the conductor thereby defining the location of the second contat hole;

refilling the etched-away opening with a material of the same characteristic as the insulating film; and etching the layer of the insulating film that has been refilled with a single etching medium to thereby simultaneously form the first contact hole opening to the semiconductor substrate or the electric connection member buried in the insulating film, and the second contact hole opening to the conductor.

According to the above method of the present invention, the protective film above the conductor, where the second contact hole is to be formed, is removed in advance, when the etched-away opening is formed to expose the top portion of the corresponding conductor from the surface of the insulating film, and the etched-away opening is refilled. Under this condition, it is possible to form the second contact hole substantially under the same condition as in etching of the first contact hole.

Moreover, in the formation of the etched-away opening, because an etching medium is used which exhibits a greater etching rate to the protective film than to the insulating film, the etched-away opening does not have its circumferential wall become like a beer barrel or taper off nor does it incur an etching stoppage at the interface between the insulating film and the protective film caused by a change of the kind of etching medium, so that the protective film can be etched so as to have specified parts appropriately removed.

Therefore, according to the above-mentioned method of the present invention, a final etching process to form the first and second contact holes after refilling of the etched-away opening can be carried out substantially under the same condition, and therefore both contact holes can be formed collectively by an etching process using a single etching mask having arranged therein two opening patterns for the first and second contact holes.

The above-mentioned conductors include gate electrodes or signal lines of field-effect semiconductor devices formed on a semiconductor substrate and various kinds of conductive parts formed on the semiconductor substrate.

The etching rate of the etching medium with respect to the protective film can be made 1.3~2.0 times that of the insulating film.

When the insulating film is silicon oxide and the protective film is a silicon nitride film used as an etching stopper in a self-aligned contact process, a mixed gas of $CHF_3$ and CO as the etching medium.

DESCRIPTION OF THE EMBODIMENTS

The present invention will be described in detail by referring to preferred embodiments illustrated in the accompanying drawings.

<Embodiment 1>

Figure 1A:
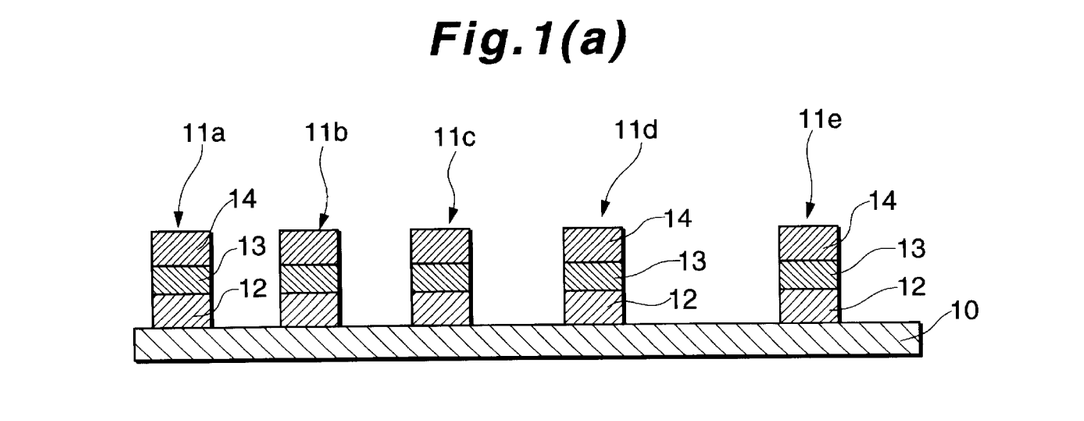
FIGS. 1(a) to 1(d) show a manufacturing process in a first embodiment of the method for forming contact holes according to the present invention (Part 1)
Figure 1B:
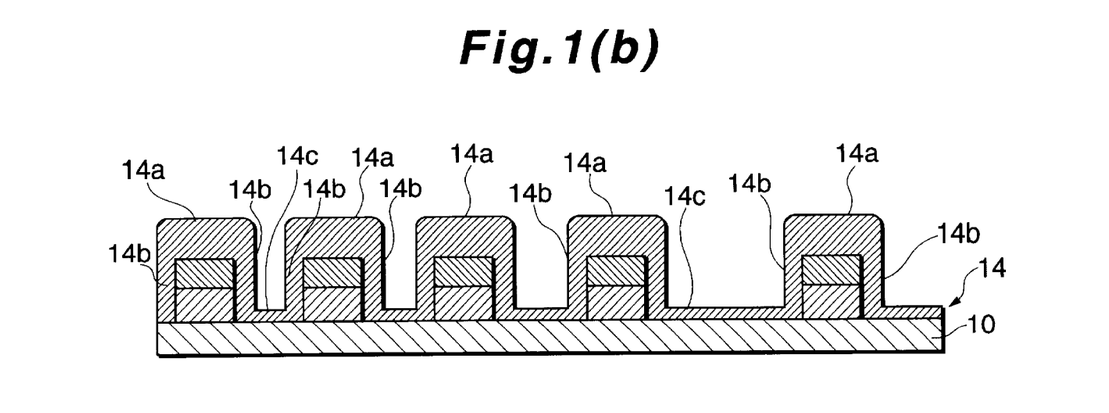
Figure 1C:
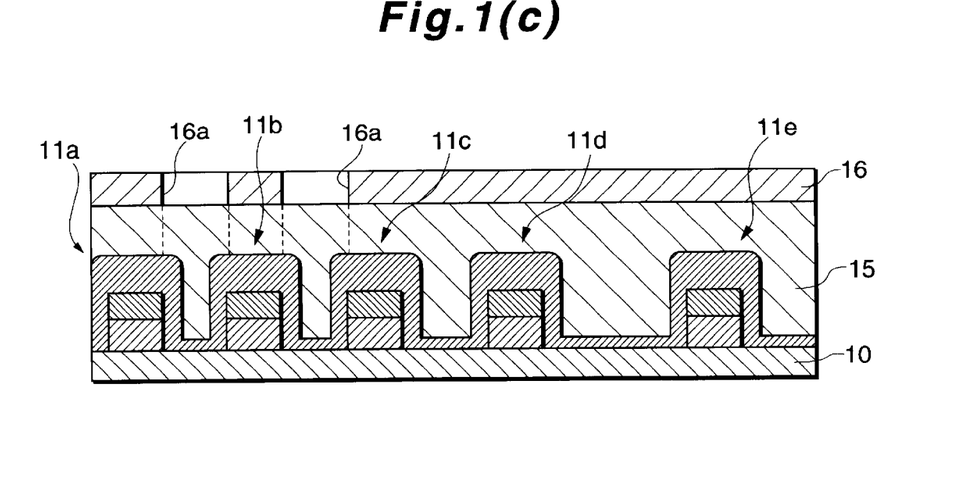
Figure 1D:
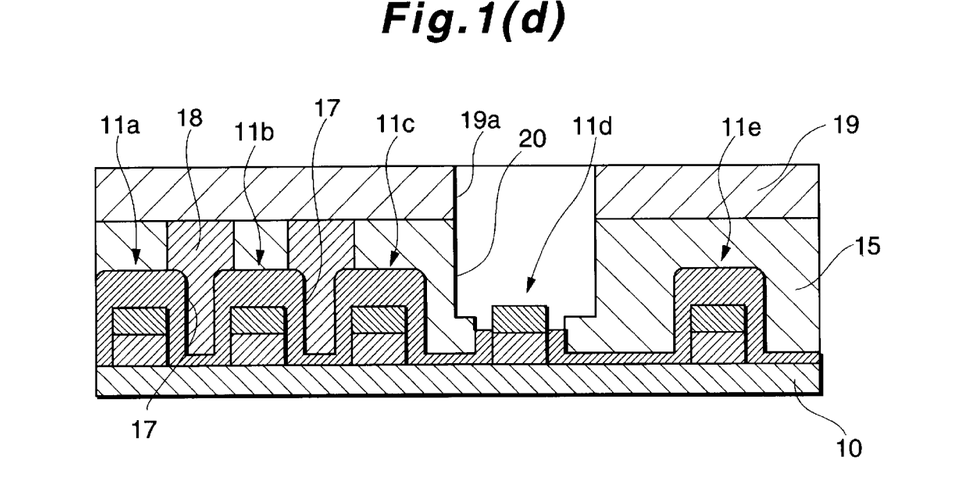
Figure 2A:
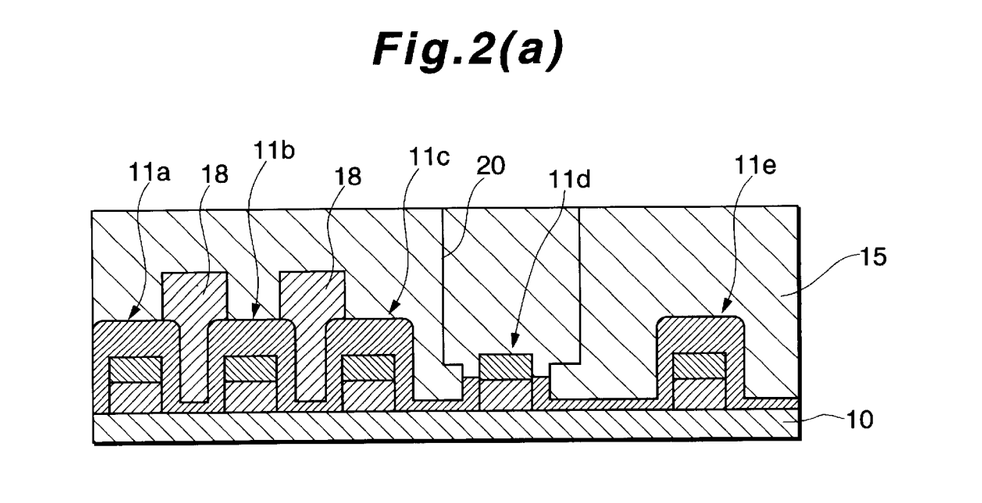
FIGS. 2(a) to 2(b) show a manufacturing process in the first embodiment of the method for forming contact holes according to the present invention (Part 2)
Figure 2B:
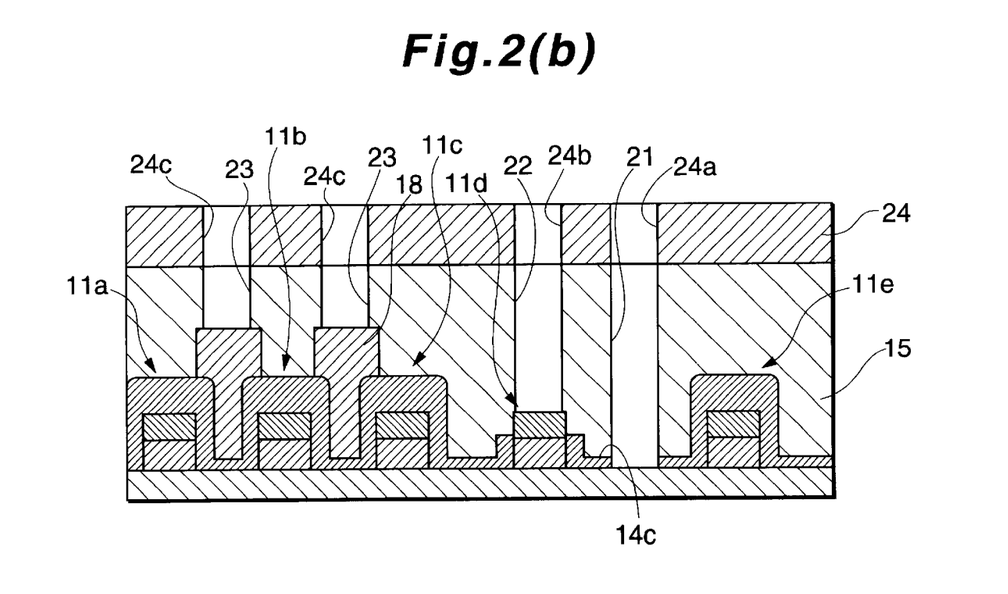

FIGS. 1 and 2 show a first embodiment of a semiconductor device manufacturing process according to the present invention.

As shown in FIG. 1(a), a plurality of gate electrodes 11 (11a to 11e) for MOS transistors are formed in parallel and mutually spaced apart in an active region of a silicon semiconductor substrate 10, for example.

In the illustrated example, each gate electrode 11 has a well-known multi-layered structure including a polysilicon layer 12 containing impurity atoms and a tungsten silicide layer 13 (provided for increased electric conductivity), and is covered at the top surface with a protective film 14 of a silicon nitride, for example. Those gate electrodes 11 are provided by depositing polysilicon and silicide in this order on the substrate 10, for example, through an intermediary of a well-known gate electrode not shown, then forming a protective film 14 of silicon nitride on the stacked structure by photolithography, and subsequently removing unwanted portions of the stacked structure and the gate oxide film by selective etching with the protective film used as the etching mask.

Though not illustrated, by using the gate electrodes 11 each having a protective film 14 at the top portion as a mask, impurity atoms to form the source and drain regions are injected into the substrate 10 on either side of the gate electrodes 11 by ion implantation, for example.

After the source and drain regions corresponding to the gate electrodes 11 are formed, as shown in FIG. 1(b), a silicon nitride film of the same material as that of the above-mentioned protective film 14 is deposited by CVD, for example, to cover each gate electrode 11.

By the deposition of the silicon nitride material of the side-wall portions 14b to cover the side walls of the gate electrodes 11 are formed in a manner continuous with the top portions 14a of the protective films 14, and bottom portions 14c with a thin thickness are formed between the gate electrodes 11 on the substrate 10 in a manner continuous with the side-wall portions 14b. As a result, the thickness of the top portions 14a of the protective film 14 increases by an amount corresponding to the thickness of the bottom portions 14c.

After the silicon nitride film has been deposited, as shown in FIG. 1(c), to bury the silicon nitride film, an interlayer insulating film 15, of a silicon oxide film, for example, is formed. The surface of the interlayer insulating film 15 is subjected to a flattening process. To form contact holes, which open to the source and drain regions in the active region of the substrate 10 between desired gate electrodes 11, an etching mask 16 having openings 16a that correspond to desired contact holes is formed on the flattened surface of the insulating film 15 by a self-aligned contact process. In the example illustrated, self-aligned contact holes are formed respectively between the gate electrodes 11a and 11b and between the gate electrodes 11b and 11c.

The insulating film 15 is etched by selective etching with the etching mask 16. As an etching medium, a CF-based etching gas, for example, is used.

This etching gas exhibits a sufficiently higher etching rate to the insulating film 15 of silicon oxide than to the protective film 14 of silicon nitride. Therefore, when those portions of the insulating film 15 which correspond to the openings 16a, 16a of the etching mask 16 are removed and consequently some parts of the top portions 14a, the side-wall portions 14b and the bottom portions of the protective film 14 are exposed to the etching gas, the bottom portions 14c of thin thickness are removed in a relatively short time, but the top portions 14a and side-wall portions 14b except for the bottom portions 14c remain after the portions between the side-wall portions 14b of the insulating film 15 have been removed.

As described above, the top portions 14a and the side-wall portions 14b of the protective film 14, which have been well known to function substantially as etching stoppers. Therefore, as shown in FIG. 1(d), desired self-aligned contact holes 17, 17 are formed with high accuracy between the gate electrodes 11 by the etching stopper action of the protective film 14 provided in conjunction with the gate electrodes regardless of the placement accuracy with which the etching mask 16 is placed.

Plugs 18 are formed to fill up the contact holes 17, 17. The plugs 18 are made of impurity-doped polysilicon, for example, and serve as conductors. After the plugs 18 are formed, the etching mask 16 is removed.

After this, a first contact hole 21 (refer to FIG. 2(b)) that opens to the active region of the substrate 10 and a second contact hole 22 (refer to FIG. 2(b)) that opens to the gate electrode 11 as a conductor are formed without using the above-mentioned self-aligned contact process. Before the contact holes 21 and 22 are formed, the protective film 14 is removed which is on the desired gate electrode 11 where the second contact hole 22 is to be formed.

As shown in FIG. 1(d), when the above-mentioned second contact hole 22 is formed on the, gate electrode 11d, for example, the surface of the insulating film 15 is subjected to a flattening process, and an etching mask 19 having an opening 19a to partially expose that portion of the insulating film which is located above and corresponds to a desired gate electrode 11d is formed on the flattened surface of the insulating film 15.

The diameter of the opening 19a of the etching mask 19 is preferably sufficiently larger than the width dimension of the gate electrode 11d.

An etched-away opening 20 is formed in the insulating film 15 by removing that portion of the insulating film 15 which is located above the gate electrode 11d by etching with the mask 19 mentioned above.

In the above etching, a mixed gas of $CHF_3$ and CO, for example, is used as an etching medium. This etching gas exhibits a higher etching rate to the protective film 14 of silicon nitride than to the insulating film 15 of silicon oxide. Therefore, by suitably setting the composition of components of this etching gas, it is possible to obtain an etching gas which has an etching rate of 1.3, for example, with respect to the protective film 14 when the etching rate to the insulating film 15 is 1.

In etching using the above-mentioned etching gas, the insulating film 15 is etched away partially, and when the protective film 14 of the gate electrode 11d is exposed as the etching process proceeds, the protective film 14 is etched faster than the insulating film 15.

Consequently, as shown in FIG. 1(d), an etched-away opening 20 is formed as an extension of the opening 19a of the etching mask 19, and the gate electrode 11d can be exposed under the condition that the unwanted protective film 14 has been removed from the etched-away opening. In the example in FIG. 1(d), the protective film 14 has had removed its top portion 14a of the gate electrode 11d as well as upper halves of its side-wall portions 14b, which were continuous to the top portion.

In the forming process of the etched-away opening 20, the insulating film 15 and the protective film 14 react to the etching gas at their etching rates mentioned above, and therefore the insulating film does not react so strongly as the protective film 14. Accordingly, the etched-away opening 20 does not become like a beer barrel with the circumferential wall swelling outward at its middle portion nor does it taper off downwardly as it has a relatively large diameter. Therefore, an adequate opening 20 aligned with the opening 19a of the etching mask 19 can be formed by etching.

By using an etching gas which has a higher etching rate to the protective film 14 than to the insulating film 15, the opening 20 is hindered from intruding into the substrate 10, which would otherwise be caused by excessive removal of the insulating film 15.

By this forming process of the etched-away opening 20, the insulating film 15 and the protective film 14 can be removed by using a single kind of etching gas, so that it is not necessary to change over the etching gas. Therefore, a carbide film, which conventionally occurs by a changeover of the etching gas, is prevented from forming on the protective film. Thus, the etching stoppage caused by the carbide film, which is a commonplace phenomenon, is prevented, with the result that the etched-away opening 20 can be formed suitably, and the gate electrode 11d without the protective film 14 can be exposed in the opening 20.

The ratio of components of this etching gas should preferably be selected suitably so that the etching rate of the protective film 14 is in the range of 1.3 to 2.0 when the etching rate of the insulating film 15 is 1.

After the etched-away opening 20 is formed, the etching mask 19 is removed. Subsequently, as shown in FIG. 2(a), silicon oxide, which is the same material for the insulating film 15, is deposited. By this deposition, the plugs 18 are buried and the etched-away opening 20 is refilled.

After refilling the etched-away opening 20, the surface of the insulating film 15 is subjected to a flattening process. After this, as shown in FIG. 2(b), on the insulating film 15, an etching mask 24 is formed, which has openings 24a and 24b formed respectively to form the first contact hole 21 to open to the active region of the substrate 10 and the second contact hole 22 to open to the gate electrode 11, with the protective film 14 eliminated. Those openings 24a and 24b are located between the gate electrodes 11d and 11e.

In the illustrated example, in the etching mark 24, there are formed the openings 24c, 24c for third contact holes 23, 23 extending to the tops of the plugs 18, 18.

In the etching process of the insulating film 15 using the above-mentioned etching mask 24, a CF-based etching gas, such as the one used in forming the contact holes 15.

In the etching process to form the contact holes 21, 22, 23, 23 using the etching mask 24, the protective film 14 is not involved in the formation of the contact holes 22, 23, 23 with the exception of the first contact hole 21. In the formation of the first contact hole 21, the bottom portion 14c of the protective film 14 is involved in the process; however, as described above, the bottom portion 14c of thin thickness can be removed easily by the CF-based etching gas mentioned above.

Therefore, as shown in FIG. 2(b), by the etching process using a single etching mask 24 and a single etching gas, those contact holes 21 to 23, including the first and second contact holes 21 and 22 can be formed collectively.

Conductive lines, not shown, filling up the contact holes like the plugs 18 are formed in the contact holes 21, 22 and 23, and conductors as components of multi-layer wiring are formed on the insulating film 15 after the etching mask 24 is removed.

According to the method for forming the contact holes, as described above, the etched-away opening 20 is formed in conjunction with a specified gate electrode 11d, during which process the protective film 14 related to the specified gate electrode 11d is removed, and then the etched-away opening 20 is refilled with the same material as the material for the insulating film 15. By carrying out the final etching process using a single etching mask 24, which is made possible by those preparatory steps, such as refilling the opening 20, it is possible to collectively form the contact holes, including the first contact hole 21 that opens to the active region of the substrate 10 and the second contact hole 22 that opens to the gate electrode 11.

In the above-mentioned method for forming the contact holes, the contact holes, including the first and second contact holes 21 and 22 corresponding to the openings 24a and 24b of the etching mask 24 can be formed with high precision relatively easily as it becomes unnecessary to align the positions of the mask for the first contact hole 21 and the mask for the second contact hole 22.

As the material for refilling the etched-away opening 20, instead of using the same material as with the insulating film 15, it is possible to use an electrical insulating material with an etching-resistant characteristic almost the same as in the insulating film 15.

In the first embodiment, description has been made of the method for forming contact holes according to the present invention. Description will next be made of an example in which the method for forming contact holes according to the present invention is applied to conductors such as bit lines by referring to FIGS. 3 and 4.

<Embodiment 2>

Figure 3A:
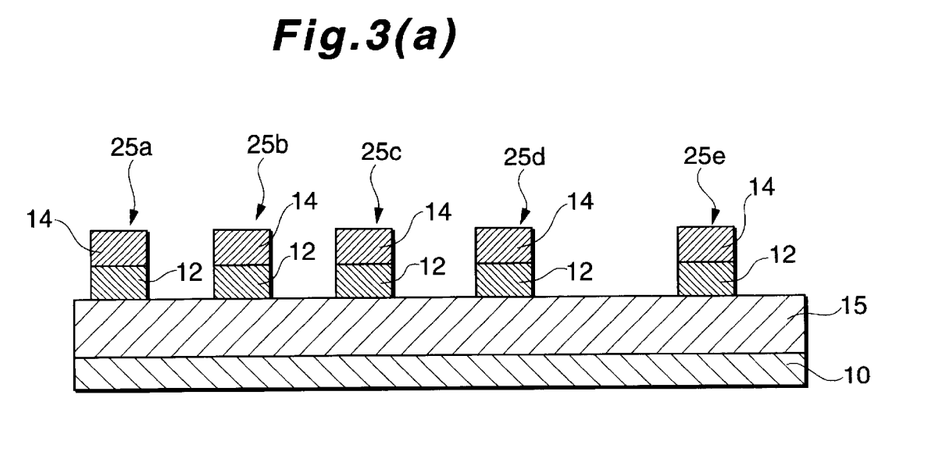
FIGS. 3(a) to 3(d) show a manufacturing process in a second embodiment of the method for forming contact holes according to the present invention (Part 1)
Figure 3B:
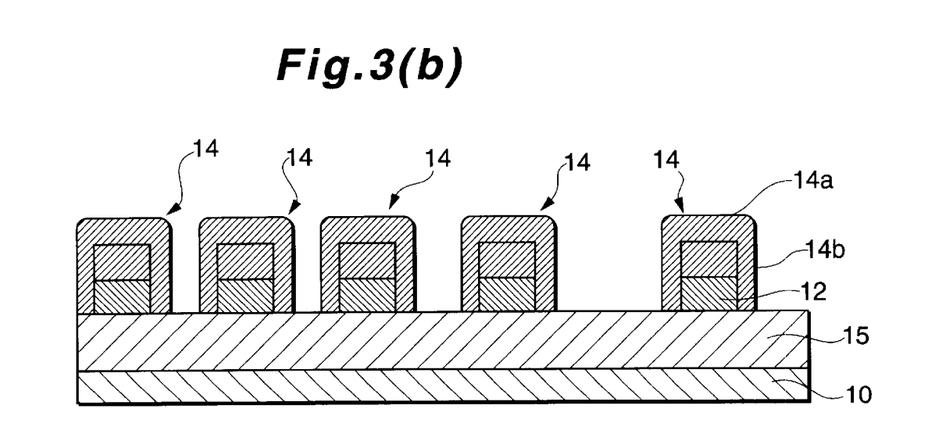
Figure 3C:
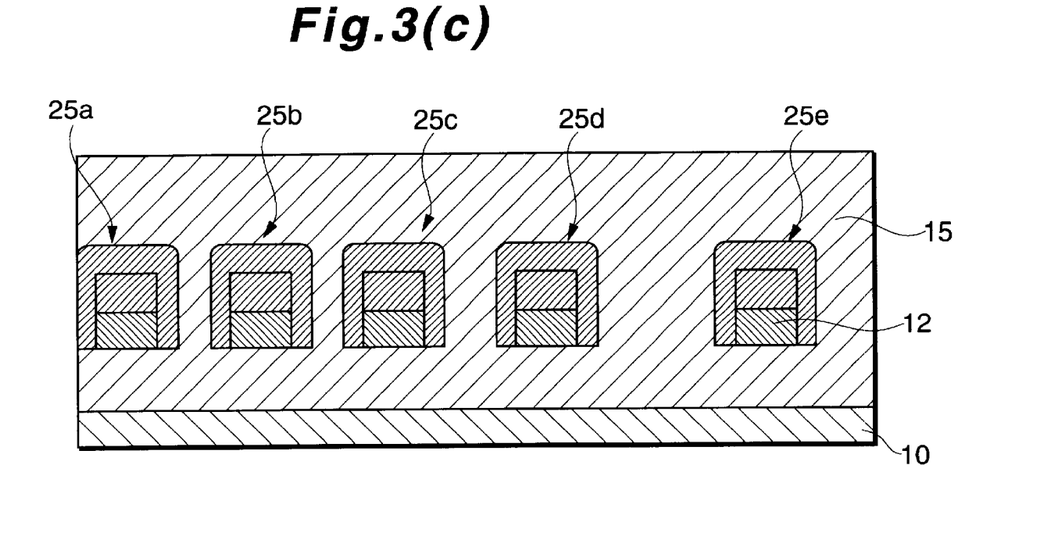
Figure 3D:
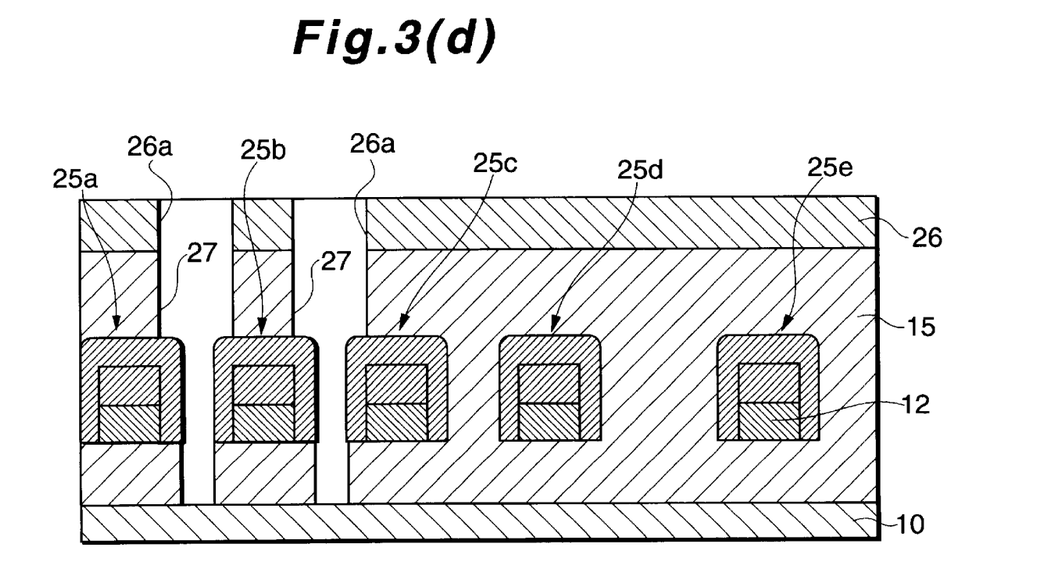
Figure 4A:
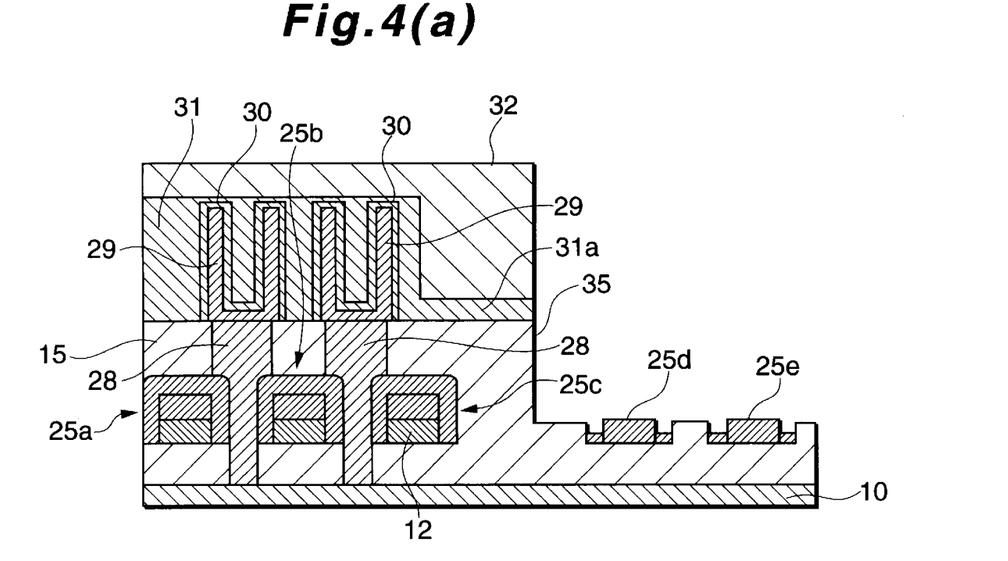
FIGS. 4(a) to 4(c) show a manufacturing process in the second embodiment of the method for forming contact holes according to the present invention (Part 2)
Figure 4B:
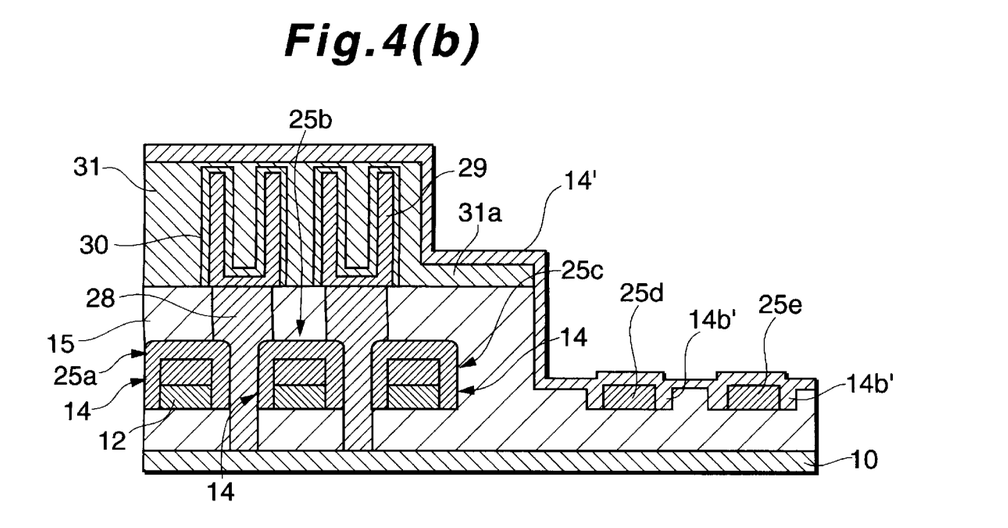
Figure 4C:
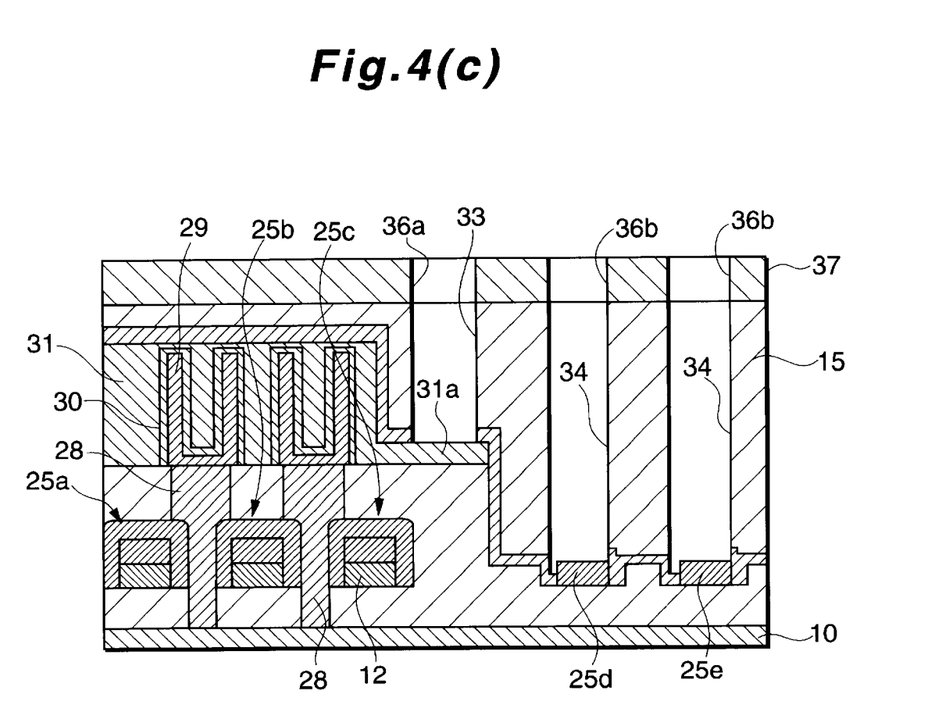

FIGS. 3 and 4 shows a second embodiment of the semiconductor device manufacturing process according to the present invention.

As shown in FIG. 3(a), a plurality of signal lines 25 (25a~25e) for transmitting electric signals are formed in parallel and mutually spaced apart on the interlayer insulating film 15 covering the silicon semiconductor substrate 10, for example.

The signal lines 25 are bit lines of memory. In the insulating film 15 under the bit lines, the gate electrodes 11 (11a~11e) are arranged in a direction at right angles with the signal lines. Those gate electrodes 11 are shown in FIGS. 1 and 2 but they are not illustrated here for simplicity of drawing.

The signal lines 25 are formed by forming an impurity-doped polysilicon layer 12 on the insulating film 15, then forming a protective film 14 of silicon nitride on the polysilicon layer by photolithographic etching and removing the polysilicon layer 12 by selective etching with the protective film used as the mask.

As shown in FIG. 3(b), by deposition of the same material as that for the protective films 14 formed over the top portions of the signal lines, the top portions 14a of the protective film 14 and the side-wall portions 14b, which are continuous to the top portions and covering the side portions of the signal lines 25, are formed, so that the signal lines 25 are covered with the top portions 14a and the side-wall portions 14b of the protective film 14.

After the tops and the sides of the signal lines 25 are covered with the protective film 14, the silicon oxide material of the insulating film 5 is additionally deposited. By this additional deposition of the material, as shown in FIG. 3(c), the signal lines 25 covered with the protective film 14 are buried in the insulating film 15.

After this, as shown in FIG. 3(d), on the insulating film 15, which has been made flat by a flattening process, an etching mask 26 is formed, which has openings 26a, 26a corresponding to desired contact holes, to form, by a self-aligned contact process, contact holes that open to the source and drain regions in the active region of the substrate 10 between desired signal lines 25.

In this illustrated example, self-aligned contact holes are formed respectively between the signal lines 25a and 25b and between the signal lines 25b and 25c.

Then, the insulating film 15 is etched by selective etching using the etching mask 26. As an etching medium for the etching process, a CF-based etching gas, which has been used in the preceding example, may be used.

With respect to this etching gas, as mentioned above, the top portions 14a and the side-wall portions 14b of the protective film 14 work substantially as etching stoppers. Therefore, as shown in FIG. 1(d), desired self-aligned contact holes 27 that extend to the substrate 10 are formed with high accuracy between the signal lines 25 by the etching stopper action of the protective film 14 as described above the placement accuracy or inaccuracy with which the etching mask 26 is placed.

As shown in FIG. 4(a), plugs 28 like those provided in the contact holes 27 are formed, and storage nodes 29, a dielectric film 30 covering the storage nodes 29, and a conductive layer 31, where the storage nodes 29 covered with the dielectric film 30 are buried, are formed as the components of capacitors built in conjunction with the plugs 28. The capacitor of a memory cell is formed by a storage node 29 and the conductive layer 31 having the dielectric film 30 between them.

The conductive layer 31 of the memory cell capacitor has an electric connection member 31a extending onto the insulating film 15. The conductive layer 31 is formed by a remainder of the deposited material for the conductive layer 31 after the unnecessary portions of the conductive layer 31 have been etched away by selective etching using the mask 32.

After the conductive layer 31 is patterned as mentioned above, before a first contact hole 33 (FIG. 4(c)) that opens to the conductive layer 31 and second contact holes (FIG. 4(c)) that open to the signal lines 25d and 25e as conductors are formed without using the above-mentioned self-aligned contact process, the protective layers 14 on the second signal lines 25d and 25e, on which the second contact holes 34 are provided, are removed by using the mask 32 for patterning of the conductive layer 31.

In this removal of the protective film 14, a mixed etching gas of $CHF_3$ and CO, for example, is used which is used in forming the etched-away opening 20 as mentioned above. This etching gas, as described above, exhibits a higher etching rate with the protective film 14 of silicon nitride than with the insulating film 15 of silicon oxide. Therefore, in the etched-away opening 35, the signal lines 25d and 25e are exposed without the insulating film 15 being removed excessively.

In the example shown in FIG. 4(a), after the signal lines 25d and 25e are exposed, the remaining portions 14b' of the side-wall portions 14b reduced in height exist on either side of the signal lines. In order to use remaining portions 14' as etching stoppers in etching of the second contact holes 34, after the mask 32 is removed, silicon nitride 14' is deposited additionally on the exposed conductive layer 31 and on the insulating layer 15 including the signal lines 25d and 25e as shown in FIG. 4(b).

This additional silicon nitride film 14' has a thin thickness as in the bottom portions 14c of the protective film 14 shown in FIG. 1(b), but by the deposition of additional silicon nitride, the thickness of the remaining side-wall portions 14b' left around the signal lines 25d and 25e grow in thickness by the amount of the silicon nitride film 14' additionally deposited.

As shown in FIG. 4(c), the same depositing material as that for the insulating film 15 is deposited on the silicon nitride film 14', thereby refilling the etched-away opening 35. Subsequently, after the surface of the refilled insulating film 15 has been flattened, on the insulating film, an etching mask 37 is formed which has openings 36a and 36b for forming the first contact hole 33 that opens to the electric connection member 31a and the second contact holes 34, 34 that open to the signal lines 25d and 25e.

When etching the insulating film 15 with the etching mask 37, a CF-based etching gas, for example, is used which has been used when etching the contact holes 17, 17.

In the etching process to form the contact holes 33 and 34, 34 using the etching mask 37, there is the silicon nitride film 14' of thin thickness, subjected to etching, on the electric connection member 31a and on the signal lines 25d and 25e. Being thin in thickness, the thin-thickness silicon nitride film 14' can be removed easily and does not function substantially as an etching stopper.

In contrast, the remainder 14b' of the side-wall portions made of silicon nitride left behind on either side of the signal lines 25d and 25e, because of its increased height, function as an etching stopper to securely prevent unwanted etch-away losses of the insulating film 15 on either side of the signal lines 25d and 25e due to a placement error of the etching mask 37 mentioned earlier.

According to the method for forming contact holes according to the present invention described with reference to the second embodiment, as mentioned above, the first contact hole 33 that opens to the electric connection member 31a, and the second contact holes 34, 34 that open to the signal lines 25d and 25e can be formed collectively by a final etching process using a single etching mask by steps of forming the etched-away opening 35 in conjunction with the specified signal lines 25d and 25e, removing in advance the protective in conjunction with the specified signal lines 25d and 25e, and then refilling the etched-away opening 35 with the same material as that for the insulating film 15.

Therefore, the contact holes 33 and 34 corresponding to the openings 36a and 36b of the etching mask 37 can be formed with high accuracy relatively easily.

Thus, it is unnecessary to deposit the silicon nitride film 14', for which reason the involvement of a different kind of material in etching of the insulating film 15 can be avoided, making is possible to carry out more easily the final etching process for the first contact hole 33 and the second contact holes 34, 34 using the etching mask 37.

<Embodiment 3>

In the first and second embodiments, description has been made of examples in which the first and second contact holes are formed separately. However, as shown in FIG. 5, the first and second contact holes can be formed as a common contact hole.

Figure 5A:
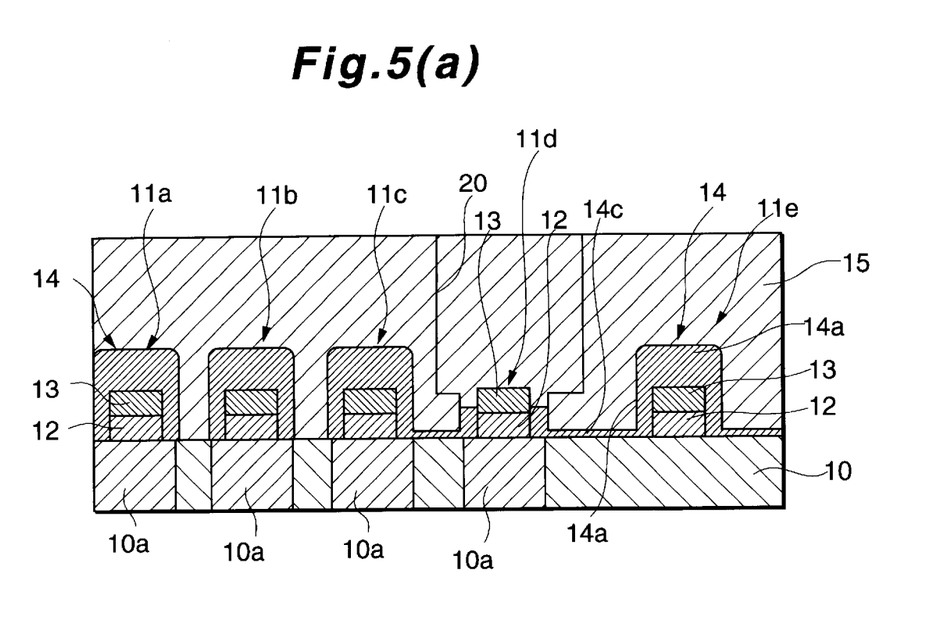
FIGS. 5(a) to 5(b) show a manufacturing process in a third embodiment of the method for forming contact holes according to the present invention.

As shown in FIG. 5(a), the gate electrodes 11 (11a to 11e) are formed on the semiconductor substrate 10 in the same way as in FIG. 2(a) showing the first embodiment. The protective film 14 of the gate electrode 11d, out of those gate electrodes 11, is partially removed by the formation of the etched-away opening 20 by etching using a mixed gas of $CHF_3$ and CO, which has been used for the insulating film 15, thereby temporarily exposing the tungsten silicide portion of the gate electrode 11d, and after this the etched-away opening 20 is refilled with a silicon oxide material.

Figure 5B:
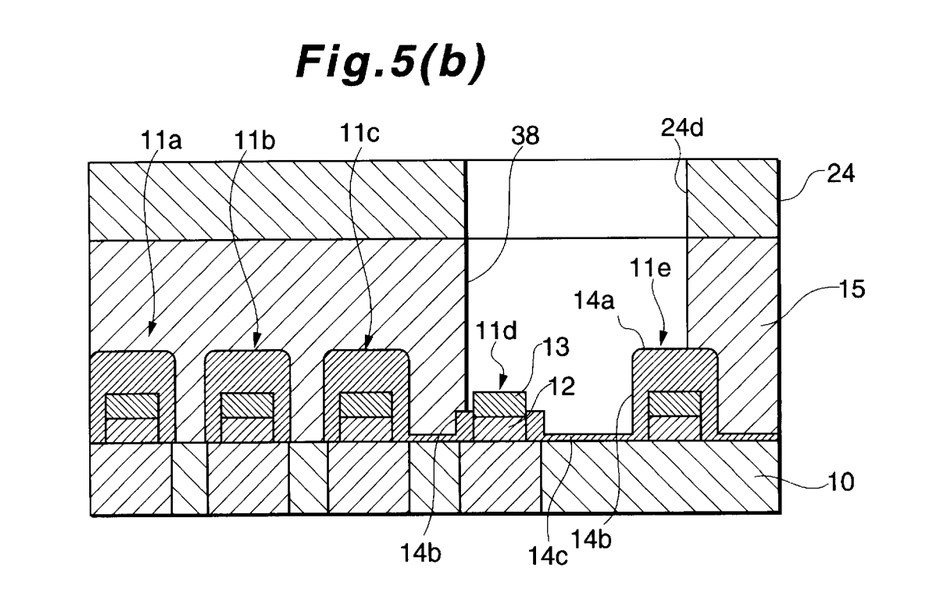

In FIGS. 5(a) and 5(b), the isolation regions 10a are shown, which delimit the active regions of the substrate 10, and the same reference numerals designate the same or like components as in FIG. 2(a), though the plugs 18 shown in FIG. 2(a) are not illustrated.

In FIGS. 5(a) and 5(b), the isolation regions 10a are shown as located under the gate electrodes 11, but actually the gate electrodes 11 are formed so as to be located on the active regions in positions shifted below or above the plane of this paper.

After the etched-away opening 20 has been refilled, the surface of the insulating film 15 is made flat by a flattening process. After this, as shown in FIG. 5(b), on the insulating film 15, an etching mask 24 is formed having an opening 24d including the gate electrode 11d and the left-half portion, as shown, of the gate electrode 11c.

In etching of the insulating film 15 using the etching mask 24, a CF-based etching gas, for example, is used which has been used in forming the contact holes 17, 17 in the first embodiment.

In the etching using the etching mask 24, an enlarged contact hole 38, which corresponds to the opening 24d of the etching mask 24, is formed in the insulating film 15 so that the enlarged contact hole 38 includes the gate electrode 11d and the region between the gate electrode 11d and the gate electrode 11e.

In the etching of the enlarged contact hole 38, out of a pair of side-wall portions 14b remaining around the gate electrode 11d, one side-wall portion 14b located at a lower end of the wall of the hole 38 prevents unacceptable damage to the substrate 10 caused by an inaccurate placement of the etching mask 24. Moreover, out of the protective film 14 of the gate electrode 11e, its top portion 14a and that part of the side-wall portion 14b which is exposed in the etching mask 37 functions as etching stoppers and serves to give a self aligned contact.

On the other hand, that thin-thickness bottom portion 14c of the protective film 14 which is located between the gate electrodes 11d and 11e does not function as an etching stopper as described earlier.

Thus, the enlarged contact hole 38 opens to the gate electrode 11d, from which the protective film 14 has been removed, and at the region between the gate electrode 11d and the gate electrode 11e and therefore functions as a common contact hole for the first and second contact holes (21 and 22).

A common contact hole such as this is advantageous in forming electrical short-circuit plugs.

In the description made so far, an insulating material, a protective film and an etching gas of specific kinds have been used, but they have been shown not for restrictive but for illustrative purposes, and various materials may be selected without departing from the spirit and scope of the present invention.

According to the present invention, as described above, by having the specified portions of the protective film removed in advance, it becomes possible to carry out a final etching process to form the first contact hole and the second contact hole under the same condition in such a way that the former is open to the semiconductor substrate and the latter passes through the protective film and is open to the gate electrode. Therefore, it is possible to form both contact holes using a single etching mask for the final etching process.

For this reason, the relative position of the two contact holes is determined by the accuracy of the pattern of the mask, so that painful effort for positioning separate masks for forming the first and second contact holes becomes unnecessary. Thus, positioning work of the two masks with high accuracy can be done away with and the fist and second contact holes can be formed accurately with relative ease.

What is claimed is:

1. In manufacturing a semiconductor device having a semiconductor substrate, a conductor formed on said semiconductor substrate and covered with a protective film, and an insulating film deposited above said semiconductor substrate to cover said conductor, a method for forming a first contact hole running through said insulating film and opening to the surface of the semiconductor substrate or to an electric connection member buried in said insulating film, and a second contact hole running through both said insulating film and said protective film and opening to said conductor under said protective film, said contact-hole forming method comprising the steps of:

forming an etched-away opening running from a upper surface of said insulating film to expose the top portion of said conductor at a bottom of said opening by using an etching medium exhibiting a higher etching rate to said protective film than to said insulating film to partially remove by etching said protective film on said conductor thereby defining the location of said second contact hole;

refilling said etched-away opening with a material of a same etch characteristic as said insulating film; and etching the insulating film that has been refilled with a single etching medium to thereby simultaneously form said first contact hole opening to said semiconductor substrate or to the electric connection member buried in said insulating film, and said second contact hole opening to said conductor wherein said first and second contact holes are laterally positioned relative to each other.

2. A method for forming contact holes according to claim 1, wherein said simultaneous formation of said first and second contact holes is done with a single etching mask.

3. A method for forming contact holes according to claim 1, wherein said conductor is a gate electrode of a field effect type semiconductor device formed on said semiconductor substrate.

4. A method for forming contact holes according to claim 1, wherein said conductor is a signal line formed on said semiconductor substrate.

5. A method for forming contact holes according to claim 1, wherein the etching rate of said etching medium to said protective film is 1.3 to 2.0 times the etching rate to said insulating film.

6. A method for forming contact holes according to claim 1, wherein said insulating film is silicon oxide, said protective film is silicon nitride used as an etching stopper used in a self-aligned contact process, and said etching medium is a mixed gas of $CHF_3$ and CO.

* * * * *